United States Patent
Chen et al.

(10) Patent No.: US 10,595,434 B2
(45) Date of Patent: Mar. 17, 2020

(54) ASSET TAG HOLDER MECHANISM TO IMPROVE ACCESSIBILITY

(71) Applicant: QUANTA COMPUTER INC., Taoyuan (TW)

(72) Inventors: Chao-Jung Chen, Taoyuan (TW); Kun-Pei Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 227 days.

(21) Appl. No.: 15/715,986

(22) Filed: Sep. 26, 2017

(65) Prior Publication Data
US 2019/0098794 A1 Mar. 28, 2019

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/14* | (2006.01) | |
| *H05K 7/16* | (2006.01) | |
| *H05K 7/18* | (2006.01) | |

(52) U.S. Cl.
CPC .......... *H05K 7/1498* (2013.01); *H05K 7/1461* (2013.01); *H05K 7/16* (2013.01); *H05K 7/18* (2013.01)

(58) Field of Classification Search
CPC ...... H05K 7/1498; H05K 7/1461; H05K 7/16; H05K 7/18; H05K 7/142; H05K 7/1417; H05K 7/14
USPC ...................... 361/679.02, 724–727, 679.01, 361/679.33–679.39
See application file for complete search history.

(56) References Cited

U.S. PATENT DOCUMENTS

| | | | |
|---|---|---|---|
| 7,474,229 B2 | 1/2009 | Franz et al. | |
| 7,591,383 B1 | 9/2009 | Milton | |
| 7,619,897 B2 * | 11/2009 | Della Fiora | H05K 7/1494 361/724 |
| 8,161,391 B2 * | 4/2012 | McClelland | G06F 11/30 709/224 |

(Continued)

FOREIGN PATENT DOCUMENTS

| | | |
|---|---|---|
| JP | 2006285593 A | 10/2006 |
| JP | 2010503916 A | 2/2010 |

(Continued)

OTHER PUBLICATIONS

TW Office Action for Application No. 106143250, dated Mar. 22, 2018, w/ First Office Action Summary.

(Continued)

*Primary Examiner* — Anthony M Haughton
(74) *Attorney, Agent, or Firm* — Nixon Peabody LLP; Zhou Lu

(57) ABSTRACT

A server rack is provided. The server rack includes at least one server component and an asset tag corresponding to the at least one server component. The asset tag includes a support bar positioned such that the at least one server component is removable from the server rack without removing the asset tag, and an actuator connected to the support bar and configured to rotate the support bar between the at least two positions. The asset tag also includes an interface supported by the support bar, wherein the interface is configured to provide an indicator regarding the location and status of the corresponding server component.

16 Claims, 9 Drawing Sheets

(56) References Cited

U.S. PATENT DOCUMENTS

| | | | |
|---|---|---|---|
| 9,342,103 B2* | 5/2016 | McClelland | G06F 1/181 |
| 2005/0195075 A1* | 9/2005 | McGraw | G06F 1/18 |
| | | | 340/500 |
| 2006/0220505 A1 | 10/2006 | Nakamura et al. | |
| 2006/0227154 A1* | 10/2006 | Barsun | G06F 1/1601 |
| | | | 345/672 |
| 2008/0068199 A1* | 3/2008 | Franz | G06F 1/181 |
| | | | 340/815.45 |
| 2008/0313539 A1* | 12/2008 | McClelland | G06F 11/30 |
| | | | 715/705 |
| 2009/0189767 A1 | 7/2009 | Primm et al. | |
| 2012/0050974 A1* | 3/2012 | Chen | G06F 1/183 |
| | | | 361/679.21 |
| 2012/0307456 A1 | 12/2012 | Cao | |
| 2013/0007329 A1* | 1/2013 | McClelland | G06F 1/1632 |
| | | | 710/303 |
| 2014/0253289 A1 | 9/2014 | Groth et al. | |

FOREIGN PATENT DOCUMENTS

| | | |
|---|---|---|
| JP | 2015076034 A | 4/2015 |
| TW | 201122774 A | 7/2011 |
| TW | 201406270 A | 2/2014 |

OTHER PUBLICATIONS

TW Search Report for Application No. 106143250, dated Mar. 22, 2018, w/ First Office Action.

Extended European Search Report for EP Application No. 18153463.7, dated Aug. 3, 2018.

JP Office Action for Application No. 2018-075036, dated Feb. 5, 2019, w/ First Office Action Summary.

JP Office Action for Application No. 2018-075036, dated Jul. 2, 2019, w/ Second Office Action Summary.

* cited by examiner

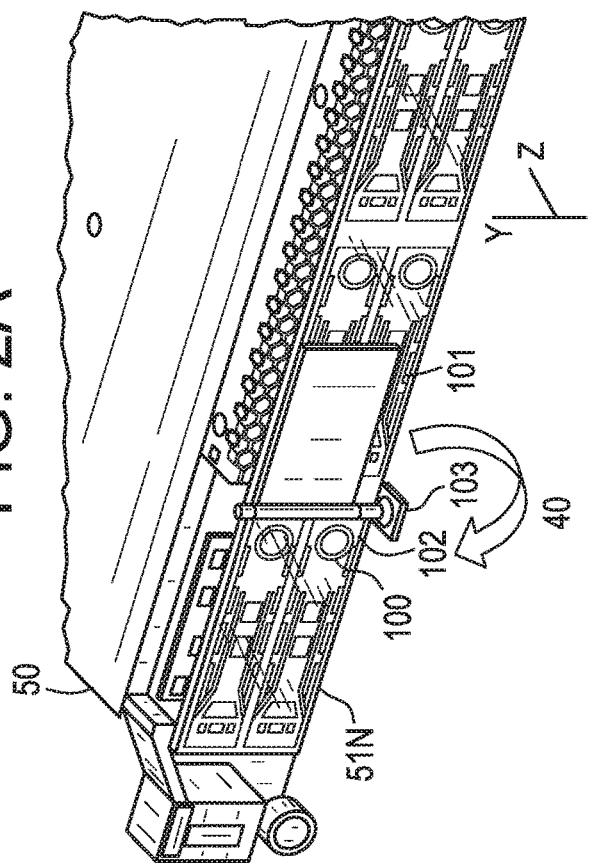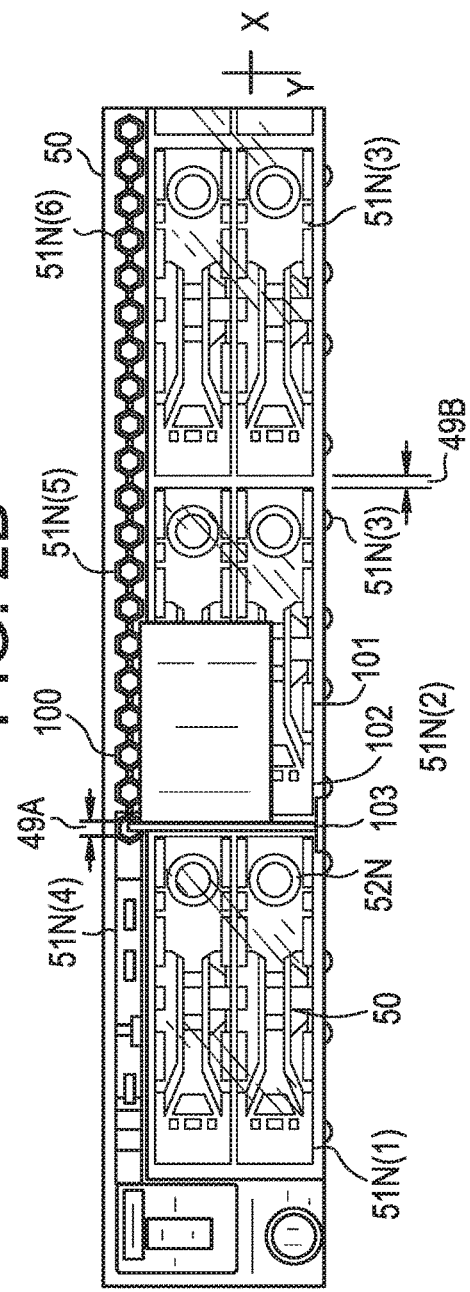

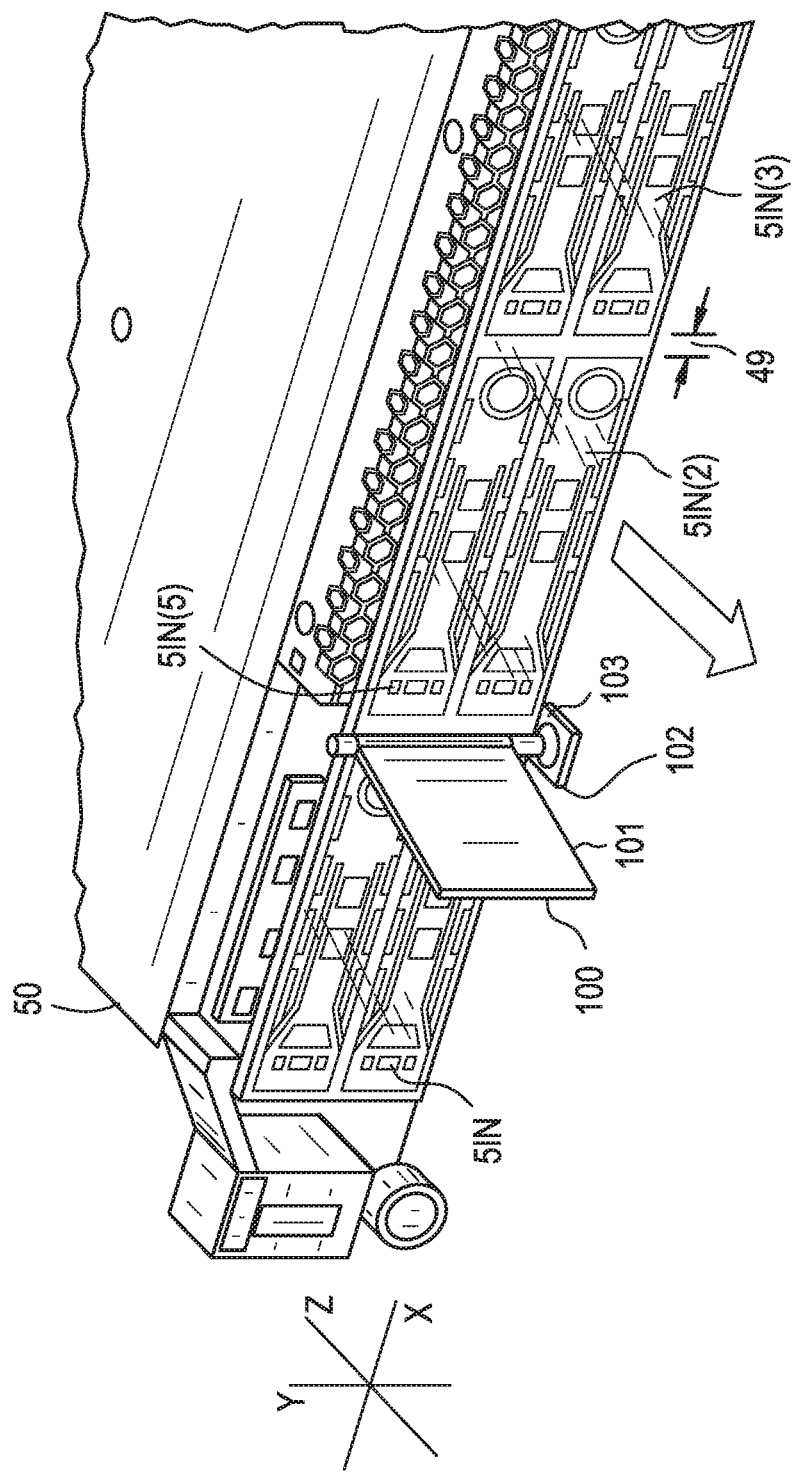

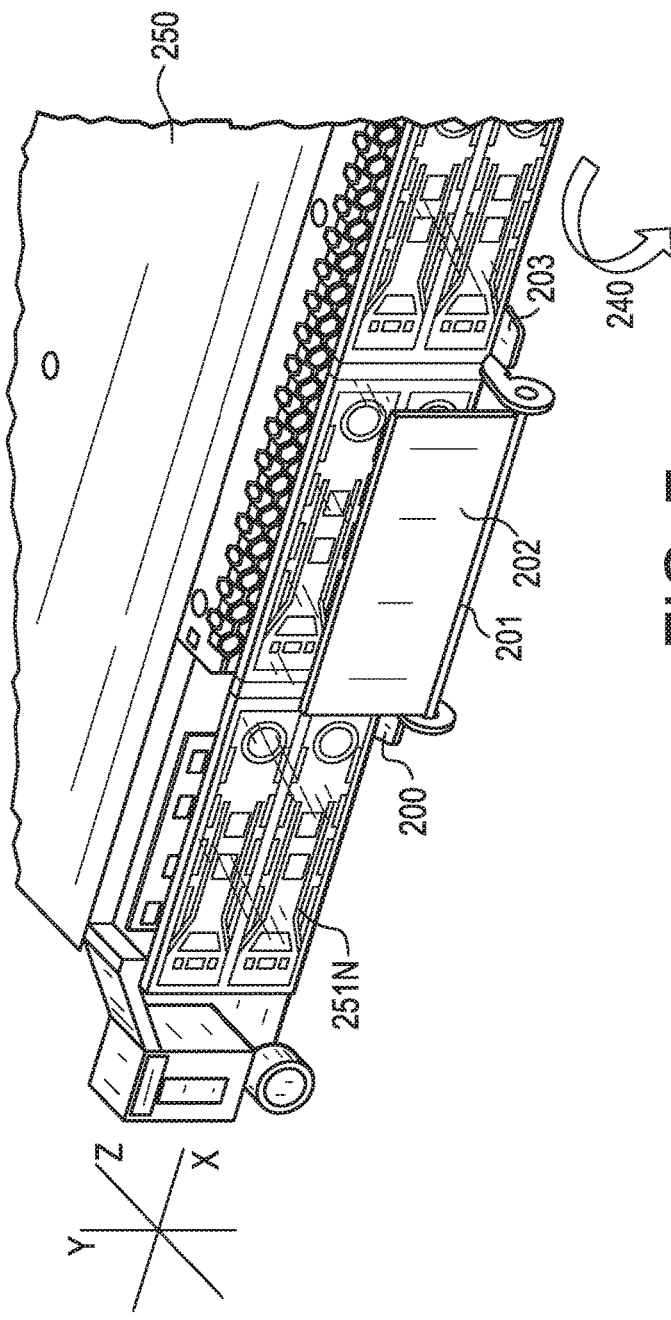
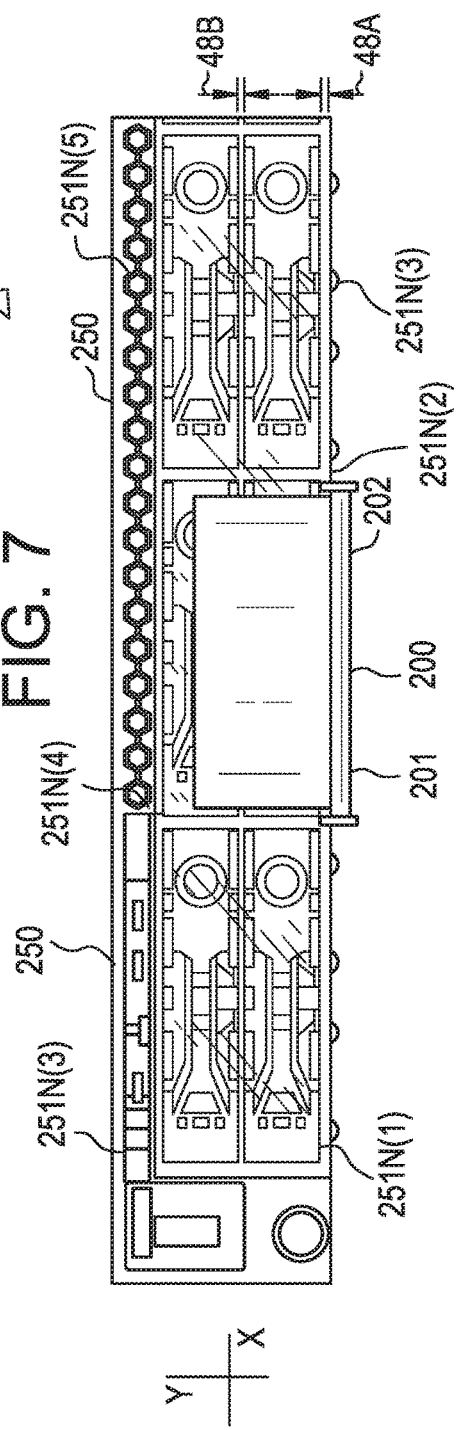

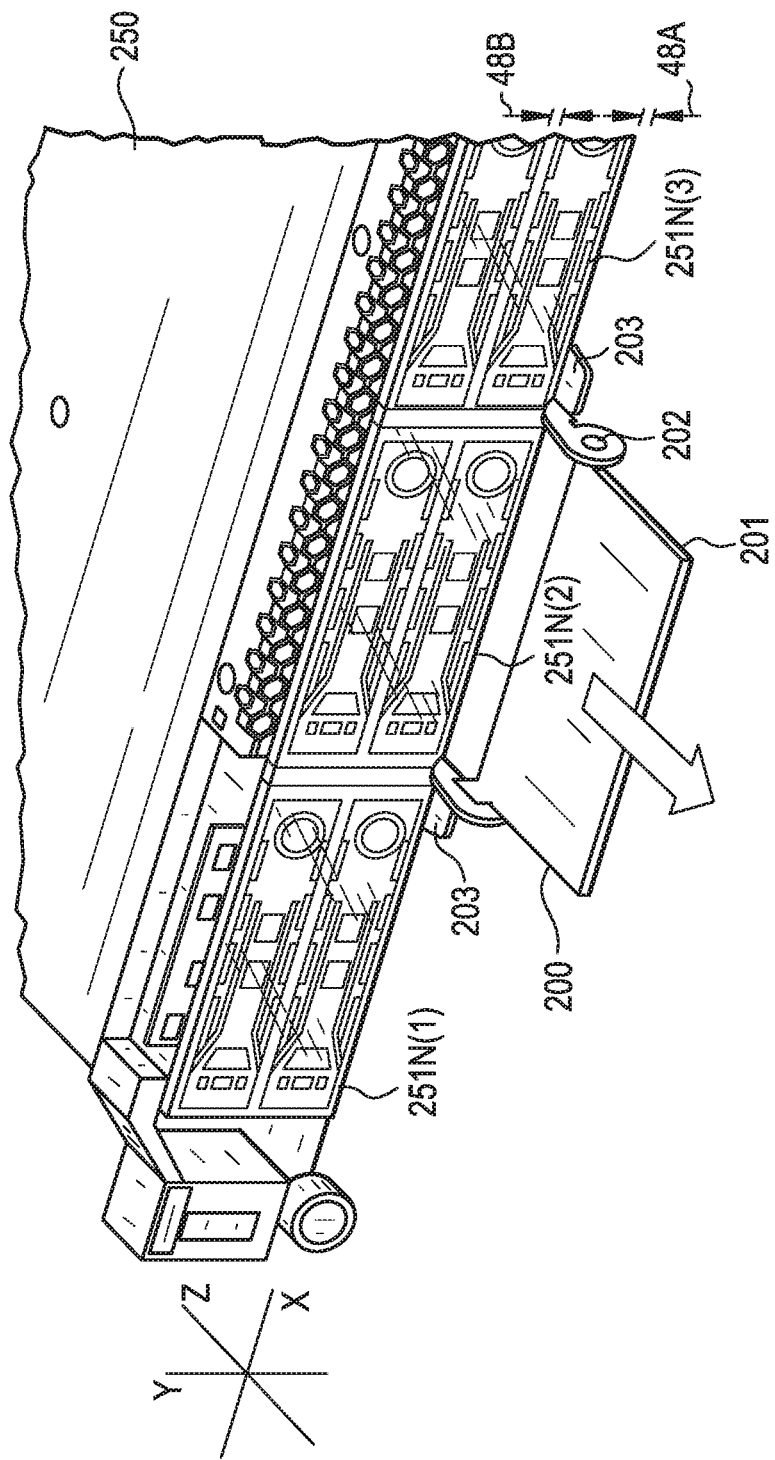

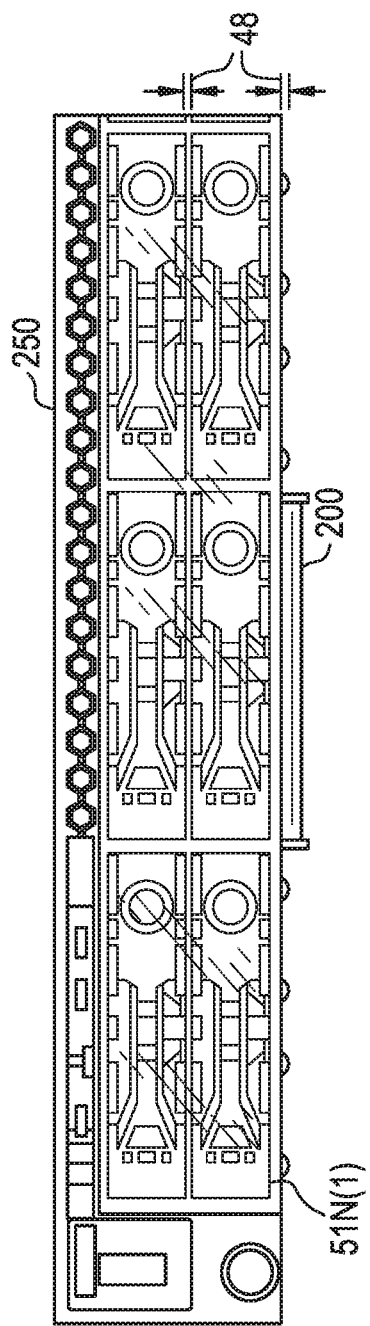
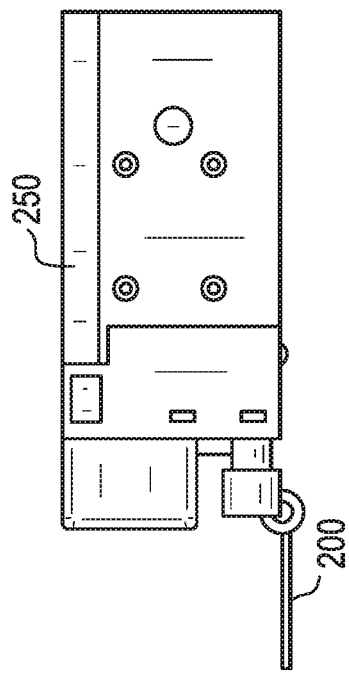
FIG. 10A
FIG. 10B

ASSET TAG HOLDER MECHANISM TO IMPROVE ACCESSIBILITY

FIELD OF THE INVENTION

The present invention relates generally to the management of data center infrastructure. More specifically, the present disclosure relates to systems, apparatuses, and methods for establishing and tracking the identity of components in the data center.

BACKGROUND

A data center is a location used to house computer systems, where the computer systems are typically arranged in a number of racks. The management component of data centers is vital to the success of the data center. One critical task in the management of data centers is the tracking of often thousands of discrete electronic components, such as servers, switches, storage devices, and power supplies. These discrete components must all be tracked in, for example, data center infrastructure management ("DCIM") software. Such tracking is necessary for the effective operation and maintenance of a data center. For example, if a specific server starts generating errors detected over a network derived from hardware failure, then the location of the server must be quickly identified so that a technician can initiate repairs/replacement. Thus the DCIM software must know both the identity of the server, as well as its physical location.

A rack is a frame or enclosure for mounting multiple equipment components in a data center environment. Each component has an open front panel, including edges or ears that protrude on each side. This allow the module to be fastened to the rack frame with screws. A "rack unit" or "U" (less commonly "RU") is a unit of measure used to describe the height of equipment intended for mounting in a rack, such as a standard 19-inch rack or a 23-inch rack. In such standard racks, one rack unit is 1.75 inches (44.45 mm) high. The size of a piece of rack-mounted equipment is typically described as a number in "U". For example, equipment that is one rack unit tall is often referred to as "1U"; equipment that is tworack units tall as "2U"; and so on.

Typically, the location of a component is provided by a rack number, which identifies the rack in the DCIM database. The rack number identifies the rack location. Furthermore, a rack vertical number can be provided to determine how high up the component is placed in the rack (for example, a 7U position).

Typically, if a specific server starts generating errors then the failed hardware may generate an indicator. This may include, for example, a blinking red light. Thus, technicians servicing a data center will often times have to canvas large areas in search of this indicator. In large data centers, it may be onerous for a technician to identify a single blinking red light in a room of thousands of discrete electronic components, such as servers, switches, storage devices, power supplies, etc. Thus, such identification is time-consuming, expensive, and prone to error. In view of the foregoing, what is needed is a means to facilitate identification of the failed component and its physical location.

SUMMARY

Embodiments of the invention concern a server rack. The server rack includes at least one server component and an asset tag corresponding to the at least one server component. The asset tag includes a support bar positioned such that the at least one server component is removable from the server rack, without removing the asset tag. The asset tag also includes an actuator connected to the support bar and configured to rotate the support bar between the at least two positions. Lastly, the asset tag includes an interface supported by the support bar, wherein the interface is configured to provide an indicator regarding the location and status of the corresponding server component.

In some embodiments, the support bar is located at a horizontal gap between two subcomponents of the server component. Alternatively, in other embodiments, the support bar is located between a vertical gap that separates two subcomponents of the server component. In some embodiments, a first position of the support bar configures the interface to be flush against the server component. Alternatively, in other embodiments, a second position of the support bar configures the interface to be perpendicular to the server component. In some embodiments of the disclosure, the interface provides a notification regarding the at least one server component. In other embodiments, the notification provides information regarding the status of the at least one server component. In some embodiments, the notification provides a failure of the at least one server component.

Embodiments of the invention concern a data center. The data center can include a server rack with multiple servers, a network, and a data center infrastructure management database. In some embodiments, the asset tag includes a support bar positioned such that the at least one server component is removable from the server rack without removing the asset tag. The asset tag also includes an interface supported by the support bar. This interface is configured to provide an indicator regarding the location and status of the corresponding server component.

BRIEF DESCRIPTION OF THE DRAWINGS

FIG. 2A shows a close up perspective view of the placement of the asset tag for identifying an associated server in a data center, in accordance with embodiments of the disclosure;

FIG. 2B shows a close up front facing view of the asset tag and the server of FIG. 2A;

FIG. 4 shows the asset tag of FIGS. 2A and 2B once in the actuated position, in accordance to an embodiment of the disclosure;

FIG. 6 illustrates a perspective close-up view of the placement of a server, in accordance to an embodiment of the disclosure;

FIG. 7 shows a close-up front facing view of the asset tag and the server of FIG. 6;

FIG. 9 shows the asset tag of FIGS. 6 and 7 once in the actuated position, in accordance to an embodiment of the disclosure; and FIGS. 10A and 10B show other views of the asset tag once of FIGS. 6 and 7 in the actuated position, in accordance to an embodiment of the disclosure.

DETAILED DESCRIPTION

Figure 1:
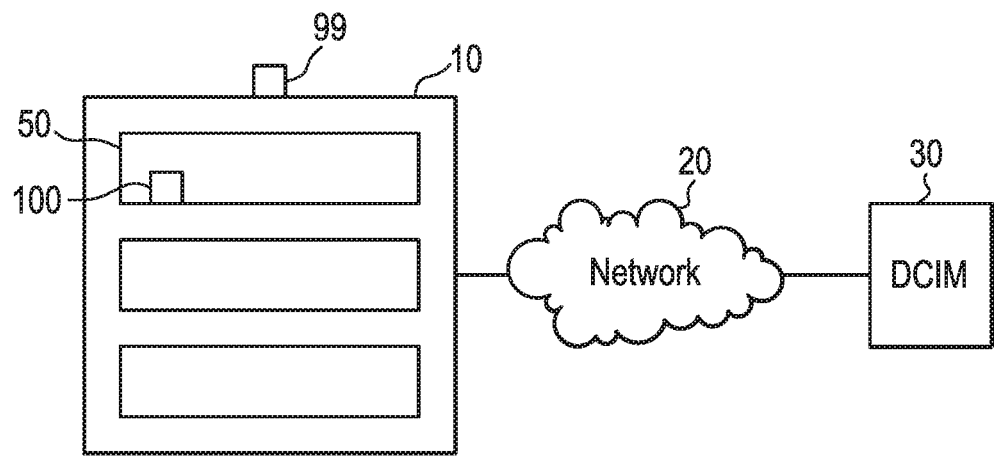
FIG. 1 is schematic of a portion of a data center in accordance with embodiments of the disclosure.

The present invention is described with reference to the attached figures, wherein like reference numerals are used throughout the figures to designate similar or equivalent elements. The figures are not drawn to scale, as they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide an asset tag to identify a failed component, such as a server, and its physical location in a data center. The asset tag is not only able to identify a failed component and its physical location, but it can also provide additional information. For example, in some embodiments, the asset tag can be an interface for a technician to discover the status and configuration Stock Keeping Unit Identifications (SKU IDs). Because the asset tag is located outside of the server components, it does not require internal space within the server component. This allows for separate installation and maintenance of the asset tag outside of the maintenance for the server component.

An electronic interface, such as for example, a touch screen, can also be provided on the asset tag to display error and diagnostic information to the technician. In some embodiments, the asset tag may have an input function that allows a technician to reset the asset tag after service has been complete. Furthermore, the asset tag can vary in shape and design to allow for rapid, low-cost, custom fabrication of high-durability. The asset tag can also vary in shape and design to allow for accessibility of the electronic components housed on the server rack. In some embodiments, the asset tag can be affixed (or AFFIX) between electronic components to a vertical rotating member. Thus, once triggered, the asset tag can rotate into view to facilitate identification by a technician, but without obstructing access to the electronic components housed on the server rack. In alternative embodiments, the asset tag can be affixed (or AFFIX) beneath an electronic component to a horizontal rotating member. Thus, once triggered, the asset tag can rotate into view to facilitate identification by a technician, but without obstructing access to the electronic components housed on the server rack. The various configurations of the asset tag are discussed in greater detail below with respect to FIGS. 1-10.

FIG. 1 shows a schematic of a data center 1. The data center 1 can include a server rack 10 with multiple switch devices 50, a network 20, and a data center infrastructure management ("DCIM") database 30. Each switch device 50 can include various components known in the art, such as central processing units, service controllers, sensors, storage devices, power supplies, fans, memory modules, etc. (not shown). The server rack 10 can include multiple switch devices 50, each with a corresponding asset tag 100. In some embodiments, each component within the switch device 50 can have a corresponding asset tag 100. In other embodiments of the disclosure, a server rack is considered an asset; thus, the server rack 10 can have a single asset tag 99. In FIG. 1, each switch device 50 has one corresponding asset tag 100, however, it should be noted that each switch device 50 can include multiple asset tags 100. Thus, different tags can be employed in different scenarios. For example, upon failure of a cooling fan within the switch device 50, an associated asset tag can be actuated. Moreover, if a power supply within the switch device 50 becomes compromised, an associated asset tag can be actuated.

As used herein, the terminology "tag" can be defined as hardware, information, signals and the like, that are not necessarily intrinsic to the circuitry or software associated with the assets to which the tags are associated. Thus, the tags can be externally attached to the respective assets and can be independent of the intrinsic workings of the respective assets.

In some embodiments, the asset tag 100 can be mounted directly on the switch device 50; on the server rack 10 while associated with the switch device 50; or on the server rack 10 and associated with the server rack 10. In some embodiments, the asset tag 100 may be attached to the respective assets by adhesive, metal fasteners, or a combination of the two. It should be realized that many other methods of physically associating the tags with respective assets are possible, and the present disclosure is not limited to the examples set forth herein. In other words, it is not necessary to mount the asset tag 100 exactly as shown in FIG. 6, and it is contemplated that the asset tag can be located at any other reasonably suitable location with respect to the assets. The switch device 50 can be mounted on the server rack 10 and associated to an asset tag 100. While reference is made herein to a "rack system," "server," "hard drive," "service controller" and the like, it should be understood that use of the singular in the examples herein does not preclude use of the plural in various embodiments. Thus, the configuration of the data center 1 is only for example, and not to limit this disclosure. For example, a data center can contain thousands of server racks, and multiple DCIM with corresponding networks of the data center.

The DCIM database 30 can be located within the data center 1, as shown in FIG. 1. In alternative embodiments, the DCIM database 30 can be remote from the data center 1. Each of the asset tags 100 can correspond with the DCIM database 30 over network 20. The network 20 may be, for example, a local area network (LAN); a wireless local area network (WLAN); a wide area network (WAN); a metropolitan area network (MAN); a global area network; a distributed computer system, such as the Internet; and a Fibre Channel fabric. The DCIM database 30 can send notifications to the asset tag 100 over the network 20. For example, if a switch device 50 encounters an operation error, such as a BMC error, the switch device 50 can actuate the asset tag 100. The notification can be converted to a visual indicator at the asset tag 100 for a technician to both identity the physical location of switch device 50 the operation error. The content of the notification is discussed in greater detail below.

FIG. 2A shows on a larger scale, the placement of the asset tag 100 for identifying an electrical component and its physical location in a data center. The asset tag 100 has an interface 101 and a post 102. The post 102 can be positioned at a switch device 50. The switch device 50 is configured to house a plurality of hard drives 51N. It should be noted that the configuration of the asset tag 100 at the switch device 50 is only for example, and not to limit this disclosure. For example, the asset tag 100 can be located at a server device, a switch device, or a power supply. The asset tag 100 can be formed from metal, plastic, composite, or a combination thereof, and configured to endure the varying heat and wear and tear of a typical data center. In certain embodiments, the asset tag 100 and its components can be made of sheet metal using conventional metal fabrication techniques such as bending, forming, and stamping. As a result, the asset tag 100 can, in some embodiments, be made inexpensively. Alternatively, the asset tag 100 and its components can be made of aluminum alloy, steel alloy, or any combination thereof. It should be realized that the asset tag 100 and its components can be made of any material with low cost of construction and durability. The materials mentioned above are only for example, and not to limit this disclosure. Thus, the present disclosure contemplates that any material or combination of materials can be used in the various embodiments without limitation. The asset tag 100 is discussed in further detail below.

The asset tag 100 can rotate about the y-axis in direction 40 via an actuator 103. The actuator 103 can include a receiver (not shown) and a power source (not shown). The power source can be low energy. The power source can be connected to the switch device 50, or to an independent power source. The power source can include electric voltage or current, pneumatic or hydraulic pressure. The asset tag 100 can include the interface 101 to provide information regarding the plurality of hard drives 51N. For example, the interface 101 can include an indicator, to alert a technician that there is a notification regarding the plurality of hard drives 51N. In some embodiments, the indicator can include messages specifically detailing the contents of the notification. In other embodiments, the indicator can include a bar code or coded message the technician is required to scan to receive the contents of the notification. The notification can include a failure notification. For example, if the switch device 50 encounters an operation error like a BMC error, the interface 101 can provide an event log. Conversely, the interface 101 can simply provide an indicator, such as a QR code, for a technician to scan to receive the details of the notification. The interface 101 can also include specialized lighting to indicate to a technician the reason for the notification. For example, in some embodiments, a red colored lighting might be actuated to indicate an error or component malfunction. In another embodiment, a blue colored lighting might be actuated to indicate to the location of a particular component a technician needs to service or replace. The specialized lighting can be coded at the DCIM database 30 (shown in FIG. 1).

The asset tag 100 can include a component for providing local proximity sensing, such as, for example, infrared (IR) components. The asset tag 100 can also include a component for intermediate range messaging, such as, for example, a Radio-frequency identification (RFID) component. The local proximity component of the asset tag 100 can have a range that allows the exchange of information between a technician, the corresponding asset to the asset tag 100, and neighboring assets. Because all assets in the server rack 50 are vertically stacked, as dictated by industry standard, a neighboring asset can include the asset that is physically below or above the asset associated with the asset tag 100. In some embodiments, a single asset flag 100 mounted to the server rack can be implemented. In such cases, the asset tag can provide notifications that specify the specific component failure. In other embodiments of the disclosure, neighboring assets can include assets located at adjacent server racks (not pictured herein). The intermediate range component can be implemented for sharing data wirelessly amongst multiple racks within the data center 1. RF communication can provide a gross measure of location, typically to within a few meters in line of sight deployments. IR communication can be implemented as well, as it offers a more precise range of approximately between 0.2 meters and 1 meter. Both the local proximity sensing and the intermediate range sensing can be used to find the position of the asset (switch device 50) within the server rack 10 (shown in FIG. 1). Alternatively, the asset tag 100 can indicate its exact position to the DCIM (shown in FIG. 1).

The notification can also simply include an identification notification. For example, the technician can interface with a DCIM (shown in FIG. 1) to inquire as to the status and location of a specific hard drive 51N. The asset tag 100 can receive instructions from the DCIM to actuate its indicator on the interface 101 to alert the technician of its location. The interface 101 can provide additional information for a technician regarding the status of the specific hard drive 51N. In some embodiments, the interface 101 can also include an input function. For example, once the technician has serviced the corresponding server component (e.g., hard drive 51N), the technician can reset the asset tag 100 to indicate that the service is complete. Furthermore, resetting the asset tag 100 via the input function can indicate to the DCIM database 30 to perform another assessment of the server component (e.g., hard drive 51N) to ensure the task is complete.

FIG. 2B shows a front facing view of the asset tag 100 and the switch device 50. The switch device 50 includes hard drives 51N(1)-51N(6). The hard drives each include an access input 52N that releases the hard drives from the switch device 50. Each hard drive is disposed in a hard drive carrier (not shown) and inserted into the switch device 50. The hard drive carriers are separated at least near the flag by vertical gaps 49A and 49B. In some embodiments of the disclosure, the asset tag 100 is placed between the hard drives 51N in gap 49A. In this example, gap 49A separates hard drives 51N(1) from 51N(2); and 51N(4) from 51N(5). Specifically, the post 102 of the asset tag 100 can be configured such that it sits between the hard drives 51N(1), 51N(2), 51N(4) and 51N(5) in gap 49. Thus, the thickness of the post 102 can be the same or less than the gap 49. Furthermore, the thickness of the interface 101 can be the same or less than the gap 49.

Figure 3:
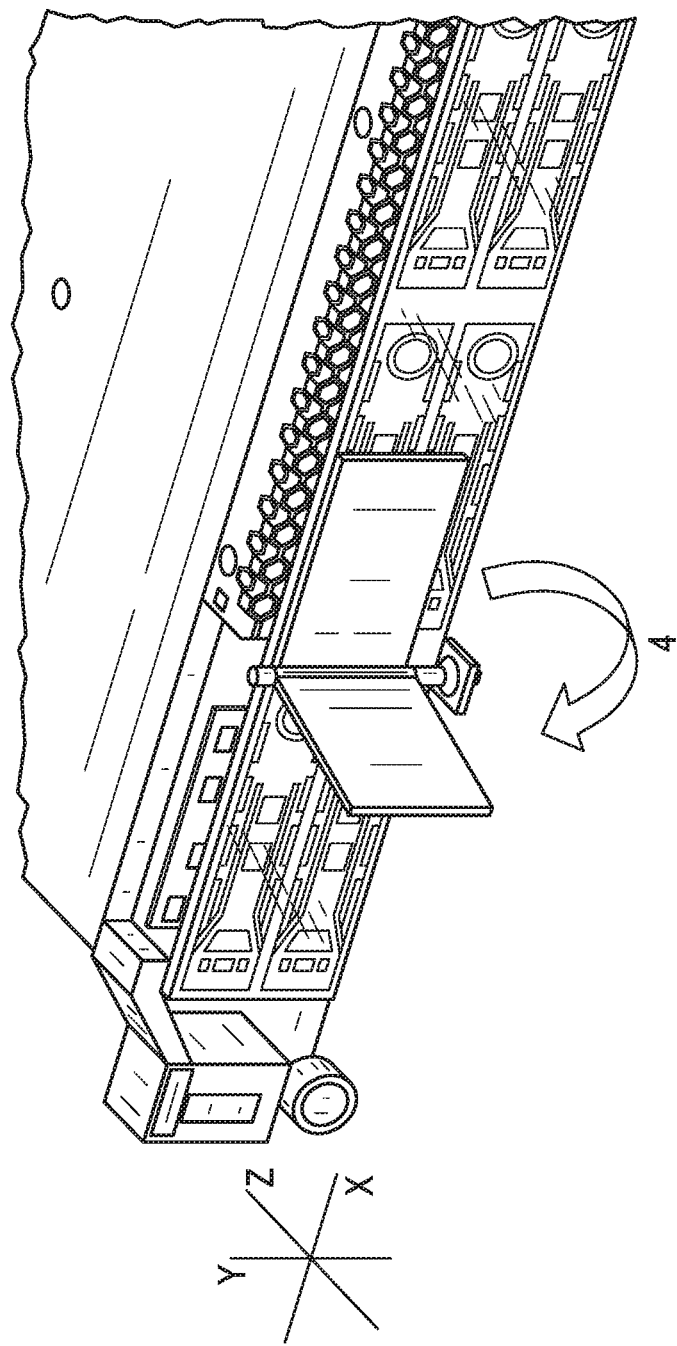
FIG. 3 illustrates the rotation of the asset tag of FIGS. 2A and 2B upon actuation, in accordance to an embodiment of the disclosure.

FIG. 3 shows the rotation of the asset tag 100 upon actuation. The asset tag is rotated from the x plane to the z plane. Once the asset tag 100 is actuated by an indicator, the asset tag can rotate 90 degrees into the sight of a technician.

Figure 5A:
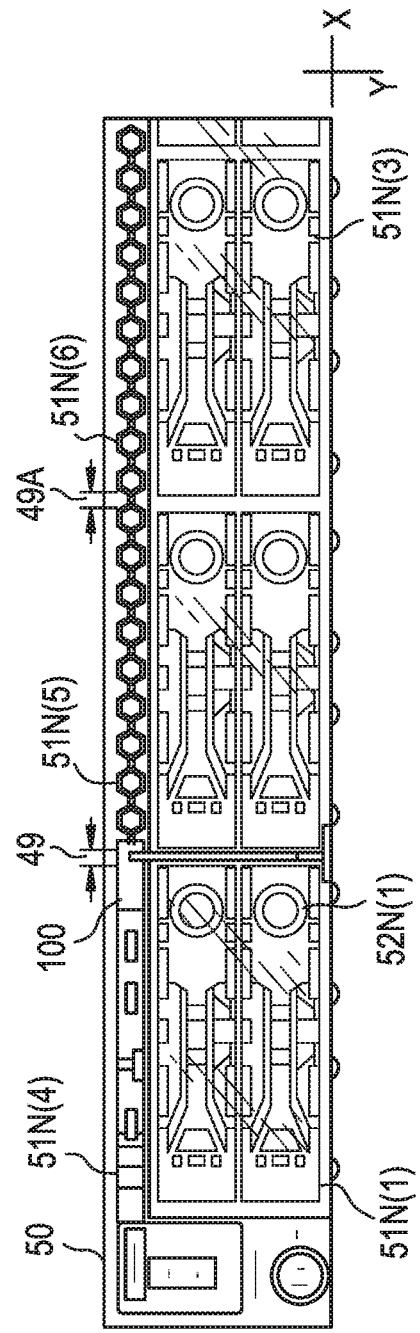
FIGS. 5A and 5B shows other views of the asset tag of FIGS. 2A and 2B once in the actuated position, in accordance to an embodiment of the disclosure.
Figure 5B:
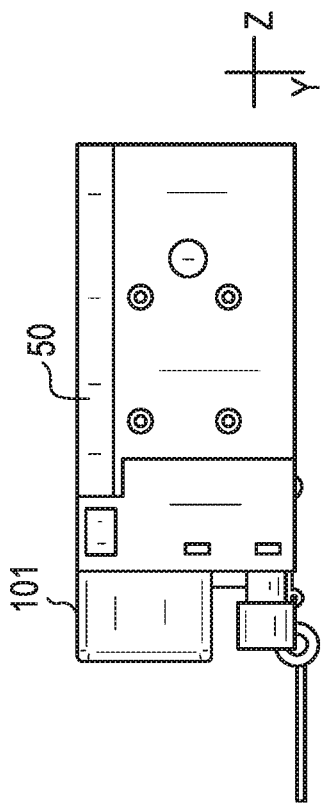

FIGS. 4, 5A, and 5B show the asset tag 100 once in the actuated position. The interface 101 becomes perpendicular to the front face of the switch device 50. The interface 101 and the post 102 of the asset tag 100 does not block access to the hard drives 51N(1), 51N(2), 51N(4), and 51N(5). As indicated in FIG. 5A, the hard drives 51N(1), 51N(2), 51N(4), and 51N(5) are fully accessible by the technician. As shown in FIG. 5B, the asset tag 100 is completely visible to a technician. The asset tag 100 can be oriented horizontally as well. This configuration is discussed in greater detail below with respect to FIGS. 6-10.

FIG. 6 shows on a larger scale, the placement of an asset tag 200 for identifying an electrical component and its physical location in a data center. The asset tag 200 can rotate about the x-axis in direction 240 via an actuator 203. The actuator 203 can include a receiver (not shown) and a power source (not shown). The power source can be low energy. The power source can be connected to the server 250, or to an independent power source. The power source can include electric voltage or current, pneumatic or hydraulic pressure. The asset tag 200 can include the interface 201 to provide information regarding the plurality of hard drives 251N. For example, the interface 201 can include an indicator, to alert a technician that there is a notification regarding the plurality of hard drives 251N. The notification can include a failure notification. For example, if the server 250 encounters an operation error like a BMC error, the interface 201 can provide an event log. Conversely, the interface 201 can simply provide an indicator, such as a QR code, for a technician to scan to receive the details of the notification. The interface 201 can also include specialized lighting to indicate to a technician the reason for the notification. For example, in some embodiments, a red colored lighting might be actuated to indicate an error or component malfunction. In another embodiment, a blue colored lighting might be actuated to indicate to the location of a particular component a technician needs to service or replace. The specialized lighting can be coded at the DCIM database 30 (shown in FIG. 1). In some embodiments, the interface 201 can include a display that specifically details the reason for the notification. The display can be a touch screen display that receives input. In some embodiments, after servicing the component that prompted the notification, the technician can reset the flag via the touchscreen.

The notification can also simply include an identification notification. For example, the technician can interface with a DCIM (shown in FIG. 1) to inquire as to the status and location of a specific hard drive 251N. The asset tag 200 can receive instructions from the DCIM to actuate its indicator on the interface 201 to alert the technician of its location. The interface 201 can provide additional information for a technician regarding the status of the specific hard drive 251N. In some embodiments, the interface 201 can also include an input function. For example, once the technician has serviced the corresponding server component (e.g., hard drive 251N), the technician can reset the asset tag 200 to indicate the service is complete. Furthermore, resetting the asset tag 200 via the input function can indicate to the DCIM database 30 (shown in FIG. 1) to perform another assessment of the server component (e.g., hard drive 251N) to ensure the task is complete.

FIG. 7 shows a front facing view of the asset tag 200 and the server 250. The server 250 includes hard drives 251N(1)-251N(6). The hard drives each include an access input 252N that releases the hard drives from the server 250. Each hard drive is disposed in a hard drive carrier (not shown) and inserted into the switch device 250. The hard drive carriers are separated at least near the flag by horizontal gaps 48A and 48B. In some embodiments of the disclosure, the asset tag 200 is placed between the hard drives 251N in gap 48A. In this example, gap 48A represents the base of hard drive 251N(2). Specifically, the post 202 of the asset tag 200 can be configured such that it sits just below hard drive 251N(2) in gap 48A. Thus, the thickness of the post 202 can be the same or less than the gap 48A. Furthermore, the thickness of the interface 201 can be the same or less than the gap 48A.

Figure 8:
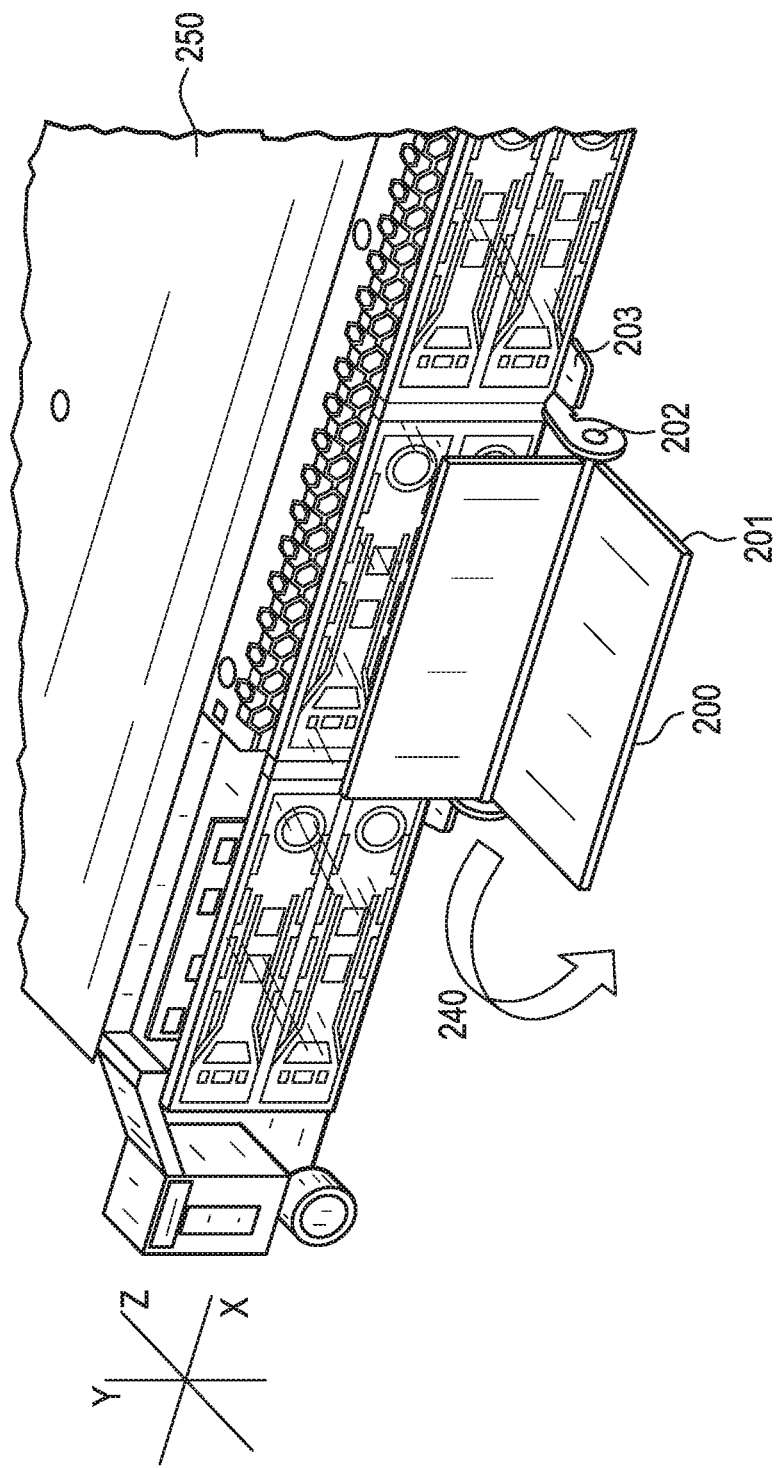
FIG. 8 illustrates the rotation of the asset tag of FIGS. 6 and 7 upon actuation, in accordance to an embodiment of the disclosure.

FIG. 8 shows the rotation of the asset tag 200 upon actuation. The asset tag is rotated from its parallel position with the y plane to become parallel with the x plane. Once the asset tag 200 is actuated by an indicator, the asset tag can rotate 90 degrees.

FIG. 9 and FIG. 10A-B show the asset tag 200 once in the actuated position. The interface 201 becomes perpendicular to the front face of the server 250. The interface 201 and the post 202 of the asset tag 200 do not block access to the hard drive 251N(2). As indicated in FIG. 10A, the hard drive 251N is fully accessible by the technician. As shown in FIG. 10B, the asset tag 200 is completely visible to a technician.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations, as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A server rack, comprising at least one server component and an asset tag corresponding to the at least one server component, wherein the asset tag comprises:
    a support bar rotatable between at least two positions, wherein the support bar is positioned such that the server component is removable from the server rack without removing the asset tag;
    an actuator including a power source, the actuator connected to the support bar and configured to rotate the support bar between the at least two positions; and
    an interface supported by the support bar, wherein the interface is configured to provide an alert indicator regarding the location and status of the corresponding server component, wherein the actuator is operable to rotate the support bar when the alert indicator is provided.

2. The server rack of claim 1, wherein the support bar is located at a horizontal gap between two subcomponents of the server component.

3. The server rack of claim 1, wherein the support bar is located between a vertical gap between two subcomponents of the server component.

4. The server rack of claim 1, wherein a first position of the support bar configures the interface to be flush against the server component, and a second position of the support bar configures the interface to be perpendicular to the server component.

5. The server rack of claim 1, wherein the interface provides a notification regarding the at least one server component.

6. The server rack of claim 5, wherein the notification provides information regarding the status of the at least one server component.

7. The server rack of claim 5, wherein the notification provides a failure of the at least one server component.

8. A data center comprising a server rack with a plurality of servers, a network, and a data center infrastructure management database, wherein each of the servers includes an asset tag connected to the data center infrastructure management database over the network, wherein the asset tag comprises:
 a support bar rotatable between at least two positions, wherein the support bar is positioned such that the server component is removable from the server rack without removing the asset tag;
 an actuator including a power source, the actuator connected to the support bar, and configured to rotate the support bar between the at least two positions; and
 an interface supported by the support bar, wherein the interface is configured to provide an alert indicator regarding the location and status of the corresponding server component, wherein the actuator is operable to rotate the support bar when the alert indicator is provided.

9. The data center of claim 8, wherein the support bar is located at a horizontal gap between two subcomponents of the server component.

10. The data center of claim 8, wherein the support bar is located between a vertical gap between two subcomponents of the server component.

11. The data center of claim 8, wherein a first position of the support bar configures the interface to be flush against the server component, and a second position of the support bar configures the interface to be perpendicular to the server component.

12. The data center of claim 8, wherein the interface provides a notification regarding the at least one server component.

13. The data center of claim 12, wherein the notification provides information regarding the status of the at least one server component.

14. The data center of claim 12, wherein the notification provides a failure of the at least one server component.

15. The data center of claim 8, wherein the interface comprises a display.

16. The data center of claim 8, wherein the interface comprises a touch screen display.

* * * * *